(12) United States Patent
Seo et al.

(10) Patent No.: US 8,471,466 B2
(45) Date of Patent: Jun. 25, 2013

(54) ORGANIC LIGHT EMITTING DIODE DISPLAY DEVICE AND METHOD FOR MANUFACTURING THE SAME

(75) Inventors: Sang-Joon Seo, Yongin (KR); Dong-Un Jin, Yongin (KR); Kie Hyun Nam, Yongin (KR); Tae-Woong Kim, Yongin (KR); Young-Gu Kim, Yongin (KR); Sung-Guk An, Yongin (KR)

(73) Assignee: Samsung Display Co., Ltd., Giheung-gu, Yongin, Gyeonggi-Do (KR)

( * ) Notice: Subject to any disclaimer, the term of this patent is extended or adjusted under 35 U.S.C. 154(b) by 282 days.

(21) Appl. No.: 12/873,242

(22) Filed: Aug. 31, 2010

(65) Prior Publication Data
US 2011/0108809 A1     May 12, 2011

(30) Foreign Application Priority Data

Nov. 10, 2009    (KR) ..................... 10-2009-0108272

(51) Int. Cl.
*H01L 51/52*           (2006.01)
(52) U.S. Cl.
USPC .............................. 313/512; 445/25; 313/504
(58) Field of Classification Search
USPC .............. 257/40, 72, 98–100, 642–643, 759; 313/498–512; 315/169.1, 169.3; 427/58, 427/64, 66, 532–535, 539; 428/690–691, 428/917; 438/26–29, 34, 82, 455; 445/24–25
See application file for complete search history.

(56) References Cited

U.S. PATENT DOCUMENTS

| | | | | |
|---|---|---|---|---|
| 2005/0157465 | A1* | 7/2005 | Wu et al. | 361/687 |
| 2006/0202222 | A1* | 9/2006 | Lan et al. | 257/98 |
| 2009/0015142 | A1 | 1/2009 | Potts et al. | |
| 2009/0168318 | A1 | 7/2009 | Moon et al. | |
| 2009/0200938 | A2* | 8/2009 | Zhu et al. | 313/506 |
| 2010/0079064 | A1* | 4/2010 | Kimura et al. | 313/504 |

FOREIGN PATENT DOCUMENTS

| | | |
|---|---|---|
| JP | 2006147192 | 6/2006 |
| JP | 2009037811 | 2/2009 |
| JP | 2009-083465 | 4/2009 |
| KR | 10-2005-0048133 | 5/2005 |
| KR | 10-2005-0122302 | 12/2005 |
| KR | 10-2006-0008557 | 1/2006 |
| KR | 10-2007-0060421 | 6/2007 |

* cited by examiner

*Primary Examiner* — Donald Raleigh
(74) *Attorney, Agent, or Firm* — Robert E. Bushnell, Esq.

(57) ABSTRACT

An organic light emitting diode display device includes a substrate body that is divided into a display area and a neighboring area; an organic light emitting diode formed in the display area of the substrate body; a barrier film that is attached to the substrate body and covers the organic light emitting diode; and an adhesive agent disposed between the neighboring area of the substrate body and the barrier film. In addition, a groove pattern is recessed on one surface of the barrier film that is in contact with the adhesive agent.

20 Claims, 10 Drawing Sheets

ORGANIZING LIGHT EMITTING DIODE DISPLAY DEVICE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 10 Nov. 2009 and there duly assigned Serial No. 10-2009-0108272.

BACKGROUND OF THE INVENTION

1. Field of the Invention

The described technology relates generally to an organic light emitting diode display device and a method for manufacturing the same, and more particularly, to an organic light emitting diode display device having a barrier film and a method for manufacturing the same.

2. Description of the Related Art

An organic light emitting diode display device has a self-emission characteristic. Unlike a liquid crystal display device, since the organic light emitting diode display device does not require an additional light source, the thickness and weight of the organic light emitting diode display device may be reduced. Furthermore, the organic light emitting diode display device has high-quality characteristics such as low power consumption, high luminance, and high reaction speed, such that it is gaining more and more attention as a next-generation display device for portable electronic devices.

SUMMARY OF THE INVENTION

It is therefore an aspect for the present invention to provide an improved organic light emitting diode display device having an overall slim thickness while effectively suppressing moisture and oxygen from penetrating an organic emission layer by using a barrier film.

It is another aspect to provide a method for manufacturing the organic light emitting diode display device.

An exemplary embodiment provides an organic light emitting diode display device that includes: a substrate body that is divided into a display area and a neighboring area; an organic light emitting diode formed in the display area of the substrate body; a barrier film that is attached to the substrate body and covers the organic light emitting diode; and an adhesive agent disposed between the neighboring area of the substrate body and the barrier film. In addition, a groove pattern is recessed on one surface of the barrier film that is in contact with the adhesive agent.

The barrier film may include an inorganic barrier layer formed on the adhesive agent and the organic light emitting diode, and an organic barrier layer formed on the inorganic barrier layer.

The barrier film may further include one or more additional inorganic barrier layers formed on the organic barrier layer.

The barrier film may further include one or more additional organic barrier layers formed on the additional inorganic barrier layers.

The additional inorganic barrier layers and the additional organic barrier layers may be alternately laminated.

In the organic light emitting diode display device, the groove pattern may surround the organic light emitting diode.

The groove pattern may have a quadrangular spiral shape.

The groove pattern may be constituted by a plurality of quadrangles.

The groove pattern may be constituted by a plurality of bars formed on the periphery of the substrate body.

A vertical cross-section of the groove pattern may have an angled saw-tooth shape.

The vertical cross-section of the groove pattern may have a curved saw-tooth shape.

The substrate body may be flexible.

Furthermore, another embodiment provides a method for manufacturing an organic light emitting diode display device that includes: preparing a substrate body that is divided into a display area and a neighboring area; forming an organic light emitting diode in the display area of the substrate body; forming a barrier film where one or more inorganic barrier layers and one or more inorganic barrier layers are alternately laminated; and attaching the inorganic barrier layer of the barrier film to the neighboring area of the substrate body by using an adhesive agent so that the barrier film covers the organic light emitting diode. In addition, a groove pattern is recessed on one surface of the inorganic barrier layer that is in contact with the adhesive agent.

The substrate body may be flexible.

The groove pattern may surround the organic light emitting diode.

The groove pattern may have a quadrangular spiral shape.

The groove pattern may be constituted by a plurality of quadrangles.

The groove pattern may be constituted by a plurality of bars formed on the periphery of the substrate body.

In the method for manufacturing the organic light emitting diode display device, a vertical cross-section of the groove pattern may have an angled saw-tooth shape.

In the method for manufacturing the organic light emitting diode display device, the vertical cross-section of the groove pattern may have a curved saw-tooth shape.

According to an embodiment, an organic light emitting diode display device has an overall slim thickness while effectively suppressing moisture or oxygen from penetrating an organic emission layer by using a barrier film.

Further, a method for manufacturing the organic light emitting diode display device can be provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
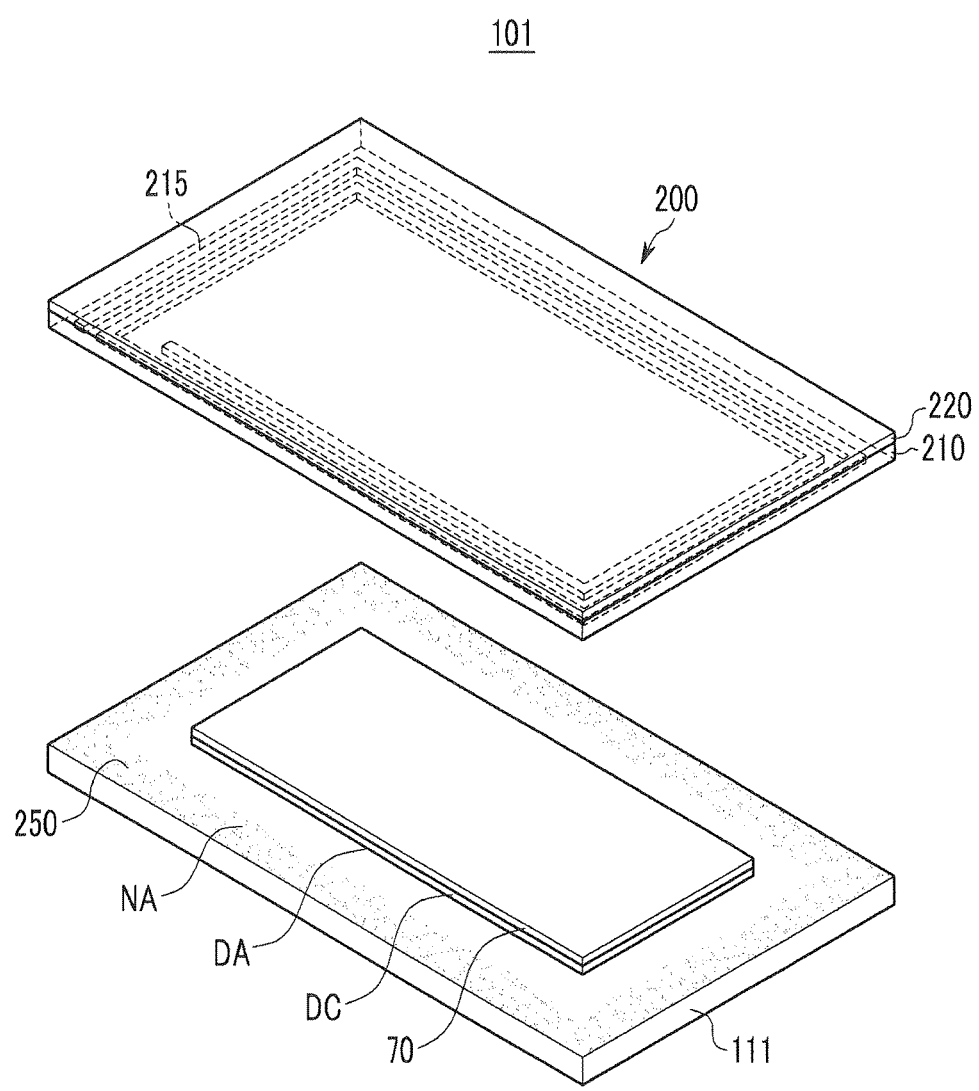
FIG. 1 is an exploded perspective view of an organic light emitting diode display device constructed as a first embodiment.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention.

Further, in the embodiments, like reference numerals designate like elements throughout the specification representatively in a first embodiment, and only elements other than those of the first embodiment will be subsequently described.

Accordingly, the drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The organic light emitting diode display device includes a plurality of organic light emitting diodes that have hole injection electrodes, organic emission layers, and electron injection electrodes. Light emission is performed by energy generated when excitons generated by a combination of electrons and holes inside the organic emission layer drop from an excited state to a ground state. The organic light emitting diode display device forms images using this phenomenon.

The organic emission layer however sensitively reacts to the external environment such with moisture or oxygen. Therefore, when the organic emission layer is exposed to moisture and oxygen, the quality of the organic light emitting diode display device may be deteriorated. As a result, in order to protect the organic light emitting diode and to prevent the moisture or oxygen from penetrating the organic emission layer, a sealing substrate is attached to a substrate body in an airtight manner where the organic light emitting diode is formed through a sealing process, or a thick protection layer is formed on the organic light emitting diode.

In order to completely prevent the moisture or oxygen from penetrating the organic emission layer by using the sealing substrate or forming the thick protection layer, however, a complicated manufacturing process needs to be performed, and it is then difficult to form the entire thickness of the organic light emitting diode display device to be thin.

The above information disclosed is only for enhancement of understanding of the background of the described technology and therefore it may contain information that does not form the prior art that is already known in this country to a person of ordinary skill in the art.

Figure 2:
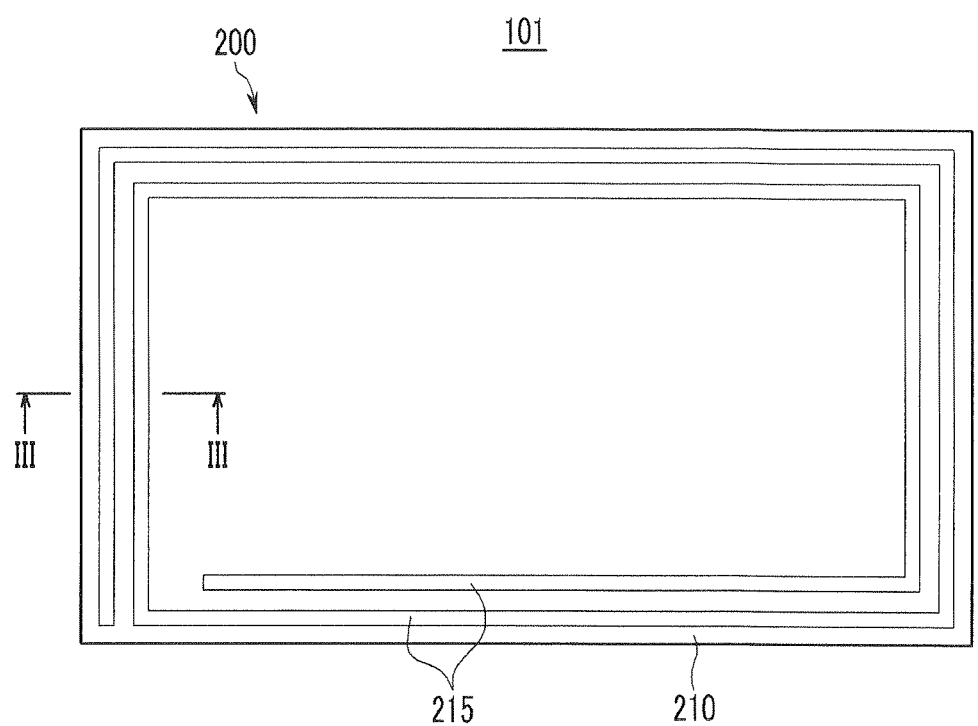
FIG. 2 is a plan layout view of an organic light emitting diode display device of FIG. 1.
Figure 3:
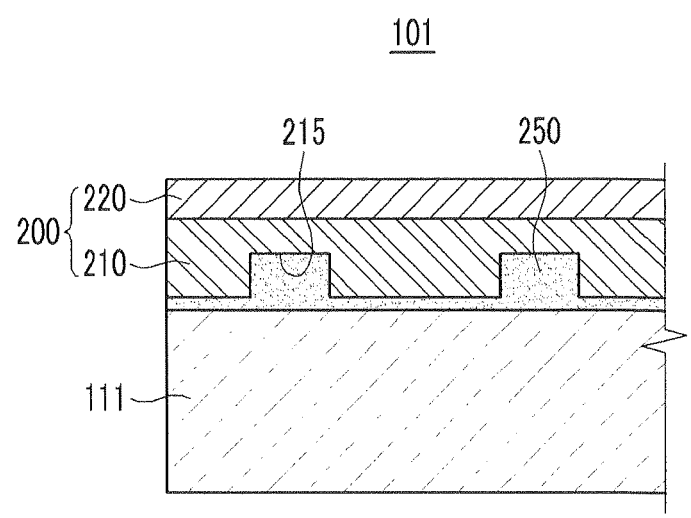
FIG. 3 is a cross-sectional view taken along line of FIG. 2.
Figure 4:
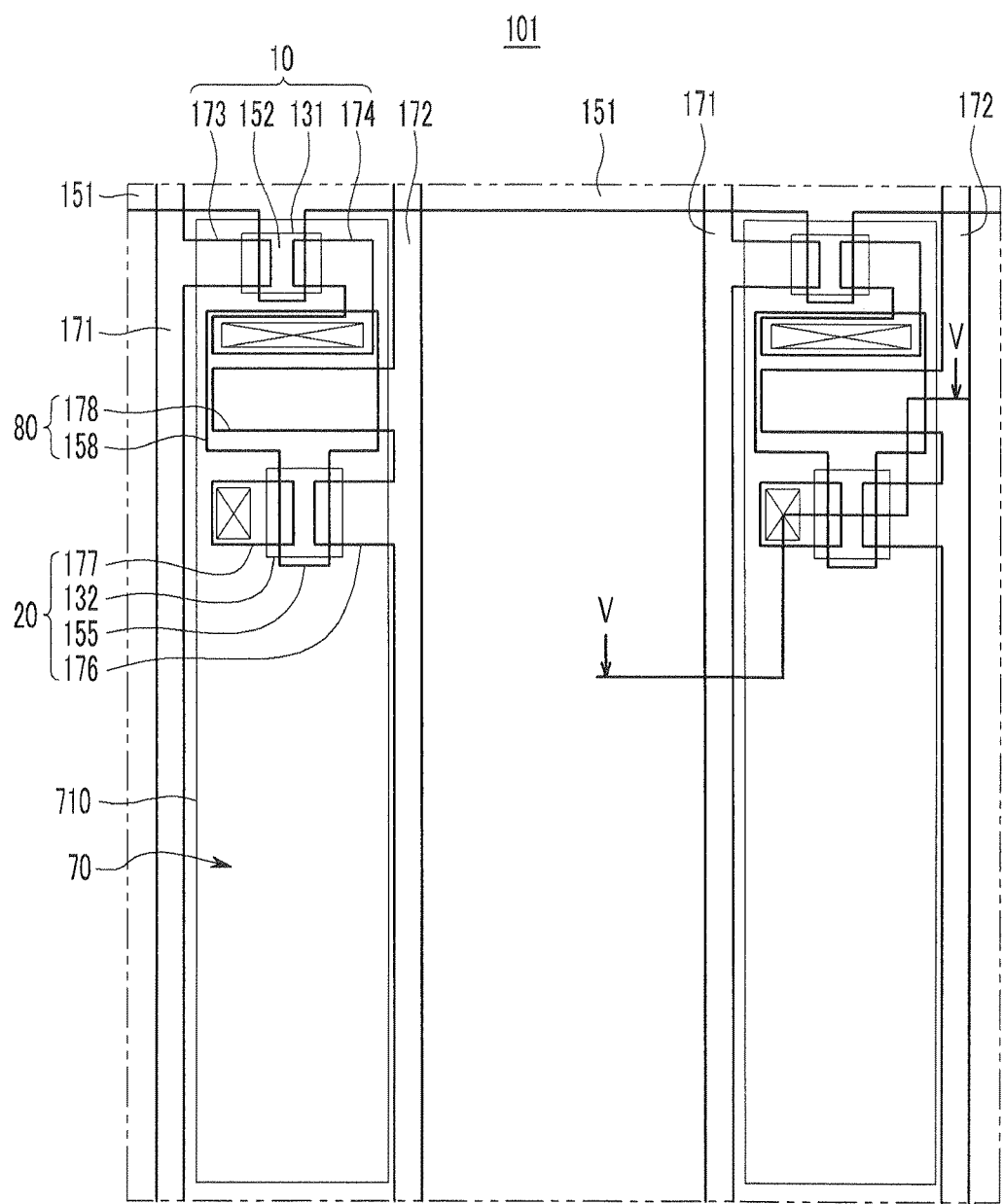
FIG. 4 is a layout view illustrating a pixel circuit of the organic light emitting diode display device of FIG. 1.

Hereinafter, a first embodiment will be described with reference to FIGS. 1 through 5. FIG. 1 is an exploded perspective view of an organic light emitting diode display device constructed as a first embodiment; FIG. 2 is a plan layout view of an organic light emitting diode display device of FIG. 1; FIG. 3 is a cross-sectional view taken along line of FIG. 2; and FIG. 4 is a layout view illustrating a pixel circuit of the organic light emitting diode display device of FIG. 1.

As shown in FIG. 1, an organic light emitting diode display device 101 constructed as the first embodiment includes a substrate body 111, a driving circuit DC, an organic light emitting diode 70, an adhesive agent 250, and a barrier film 200. FIG. 1 illustrates a state in which the barrier film 200 is not attached to the substrate body 111.

The substrate body 111 is divided into a display area DA and a neighboring area NA. Further, the substrate body 111 is made of a flexible plastic material. For example, the substrate body 111 may be made of a polyimide having excellent heat resistance. The first embodiment is however not limited thereto. Therefore, the substrate body 111 may be an insulating substrate made of glass, quartz, ceramics, etc., or a metallic substrate made of stainless steel, etc.

The driving circuit DC is formed on the substrate body 111. The driving circuit DC includes thin film transistors 10 and 20 (shown in FIG. 4), and drives the organic light emitting diode 70. Further, the driving circuit DC may be formed in the display area DA of the substrate body 111, and in some cases, may be formed in the neighboring area NA.

The organic light emitting diode 70 is formed within the display area DA of the substrate body 111 in order to emit light in dependence upon a driving signal received from the driving circuit DC.

The adhesive agent 250 is disposed on the neighboring area NA of the substrate body 111. The adhesive agent 250 may be made of, for example, an acryl- or epoxy-based material.

The barrier film 200 is attached to the substrate body 111 to cover the organic light emitting diode 70. That is, the barrier film 200 prevents moisture and oxygen from penetrating the organic light emitting diode 70. In the first embodiment, the barrier film 200 is not directly formed on the substrate body 111 where the organic light emitting diode 70 is formed, but is separately formed and then attached to the substrate body 111 through the adhesive agent 250.

Further, the barrier film 200 includes an inorganic barrier layer 210 and an organic barrier layer 220 formed on the inorganic barrier layer 210.

The inorganic barrier layer 210 is formed on the adhesive agent 250 and the organic light emitting diode 70, and is attached to the substrate body 111 through the adhesive agent 250 in the neighboring area NA of the substrate body 111.

Further, the inorganic barrier layer 210 is made of a material containing at least one of $Al_2O_3$, $TiO_2$, ZrO, $SiO_2$, AlON, AlN, SiON, $Si_3N_4$, ZnO, and $Ta_2O_5$. The inorganic barrier layer 210 may be formed through various methods known to those skilled in the art, such as an atomic layer deposition (ALD) method and a chemical vapor deposition (CVD) method.

Further, a groove pattern 215 is recessed on one surface of the inorganic barrier layer 210 that is in contact with the adhesive agent 250 in the neighboring area NA of the substrate body 111. The adhesive agent 250 may fill the groove pattern 215 in order to attach the inorganic barrier layer 210 to the substrate body 111. The groove pattern 215 surrounds the organic light emitting diode 70. As shown in FIG. 2, in the first embodiment, the groove pattern 215 has a quadrangular spiral shape. Further, as shown in FIG. 3, a vertical cross-section of the groove pattern 215 has an angular saw-tooth shape. Herein, the vertical cross-section represents a vertical cross-section of the barrier film 200.

The organic barrier layer 220 is made of a polymer-based material. Herein, the polymer-based material includes an acryl-based resin, an epoxy-based resin, a polyimide, or a polyethylene. Further, the organic barrier layer 220 may be formed through various manufacturing methods known to those skilled in the art, such as a thermal deposition process or a coating process.

Since the organic barrier layer 220 is softer than the inorganic barrier layer 210, the organic barrier layer 220 serves to alleviate stress or shock applied from the outside while suppressing vapor permeation.

By this configuration, the organic light emitting diode display device 101 constructed as the first embodiment has an overall slim thickness while effectively preventing the moisture or oxygen from penetrating the organic emission layer 70 through the barrier film 200.

In particular, the groove pattern 215 formed on the inorganic barrier layer 210 can effectively prevent the moisture or oxygen from penetrating an interface between the barrier film 210 and the adhesive agent 250.

In general, the barrier film 200 effectively prevents the moisture or oxygen from penetrating in a direction perpendicular to the barrier film. However, the moisture or oxygen can comparatively easily penetrate the interface between the barrier film 200 and the adhesive agent 250. Therefore, for the barrier film 200 to stably prevent the moisture or oxygen from being penetrated, an area where the barrier film 200 is attached to the substrate body 111 through the adhesive agent 250 is increased. For this, when the neighboring area NA of the substrate body 111 is excessively enlarged, the display area DA is comparatively reduced such that the use efficiency of the organic light emitting diode display device 101 is deteriorated.

However, in the first embodiment, the groove pattern 215 is formed on the inorganic barrier layer 210 that is in contact with the adhesive agent 250 formed within the neighboring area NA of the substrate body 111 so as to surround the organic light emitting diode 70. The groove pattern 215 may be formed on a surface of the inorganic barrier layer 210 which is in direct contact with the adhesive agent 250 formed within the neighboring area NA of the substrate body 111 so as to surround the organic light emitting diode 70. The groove pattern 215 effectively widens the interface between the adhesive agent 250 and the inorganic barrier layer 210. Accordingly, the penetration path of the moisture or oxygen through the interface between the barrier film 200 and the adhesive agent 250 is lengthened to thereby effectively suppress penetration of the moisture or oxygen.

As a result, the organic light emitting diode display device 101 constructed as the first embodiment may stably secure a water vapor transmission rate (WVTR) of $10^{-6}$ g/m²/day.

Further, since the neighboring area NA of the substrate body 111 may be minimized, the display area DA may be comparatively enlarged, thereby improving the use efficiency of the organic light emitting diode display device 101.

Hereinafter, an internal structure of the organic light emitting diode display device 101 will be described in detail with reference to FIGS. 4 and 5. FIG. 4 is a layout view illustrating a pixel circuit of the organic light emitting diode display device of FIG. 1; and FIG. 5 is a cross-sectional view taken along line V-V of FIG. 4.

Figure 5:
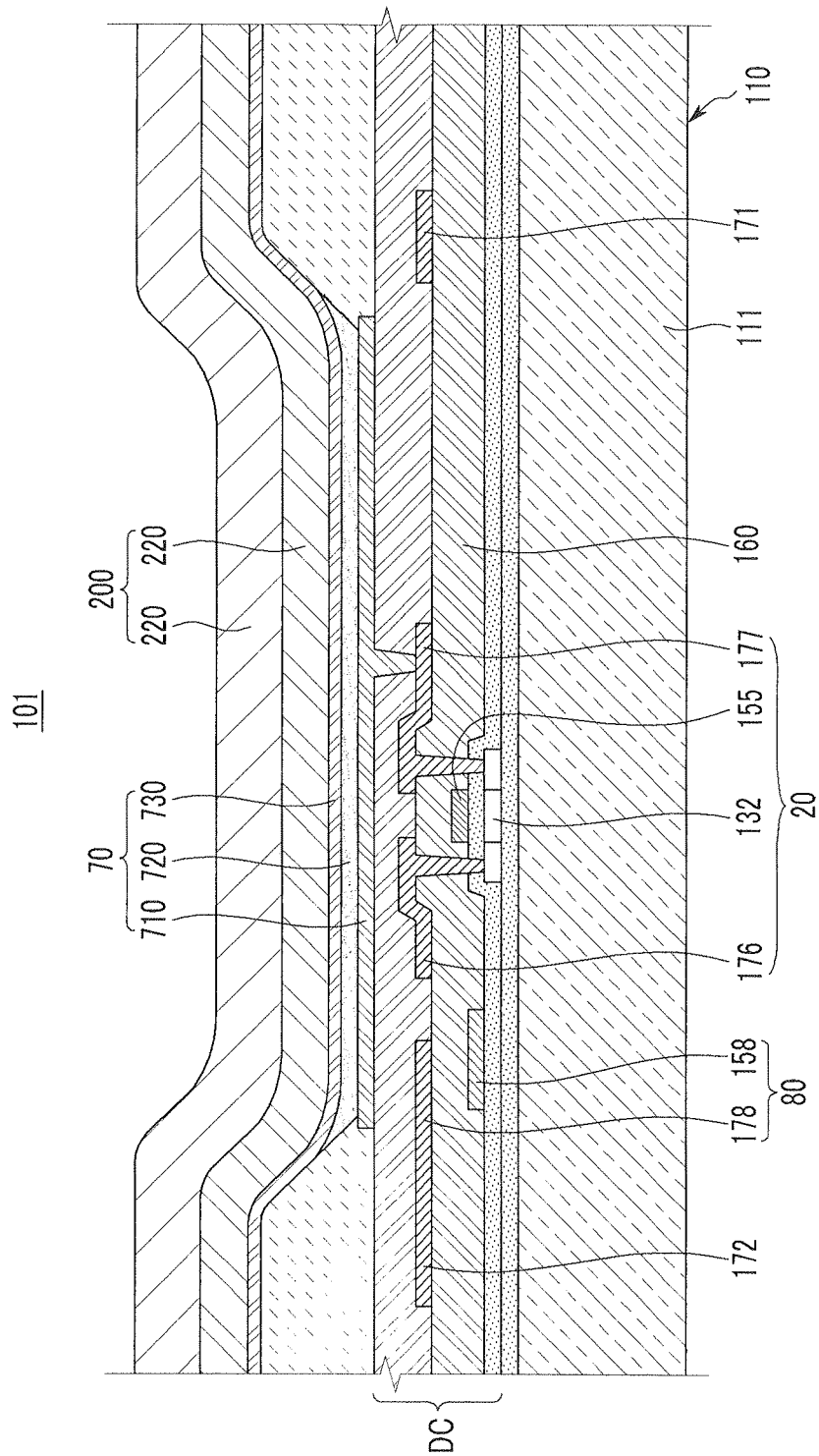
FIG. 5 is a cross-sectional view taken along line V-V of FIG. 4.

In FIGS. 4 and 5, even though an active matrix (AM) type of organic light emitting diode display device having a 2Tr-1Cap structure in which one pixel includes two thin film transistors (TFTs) 10 and 20 and one storage capacitor 80 in one pixel is shown, the first embodiment is not limited thereto. Accordingly, the organic light emitting diode display device 101 may be provided with three or more thin film transistors and two or more storage capacitors in one pixel, and may be configured to have various structures with additional wires. Herein, the pixel represents a minimum unit for displaying an image, and is disposed in each pixel area. The organic light emitting diode display device 101 displays an image through a plurality of pixels.

As shown in FIGS. 4 and 5, the display substrate 110 includes a switching thin film transistor 10, a driving thin film transistor 20, a storage capacitor 80, and an organic light emitting diode (OLED) 70 that are formed for each pixel. Herein, a configuration including the switching thin film transistor 10, the driving thin film transistor 20, and the storage capacitor 80 is referred to as the driving circuit DC. In addition, the display substrate 110 further includes a gate line 151 disposed in one direction, a data line 171 insulatively crossing the gate line 151, and a common power supply line 172.

Herein, a boundary of one pixel may be defined by the gate line 151, the data line 171, and the common power supply line 172, but is not limited thereto.

The organic light emitting diode 70 includes a first electrode 710, an organic emission layer 720 formed on the first electrode 710, and a second electrode 730 formed on the organic emission layer 720. Holes and electrodes are injected into the organic emission layer 720 from each of the first electrode 710 and the second electrode 730. When excitons generated by combination of the injected holes and electrons in the organic emission layer are transitioned from an excited state to a ground state, light is generated and emitted.

The storage capacitor 80 includes a pair of capacitor plates 158 and 178 with an interlayer insulating layer 160 interposed therebetween. Herein, the interlayer insulating layer 160 becomes a dielectric. Storage capacity is determined by electric charges stored in the storage capacitor 80 and a voltage difference between the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 serves as a switching element that selects a desired pixel to emit light. The switching gate electrode 152 is connected to the gate line 151. The switching source electrode 173 is connected to the data line 171. The switching drain electrode 174 is disposed spaced apart from the switching source electrode 173 and is connected to either capacitor plate (158 in this case).

The driving thin film transistor 20 applies driving power for allowing the organic emission layer 720 of the organic light emitting diode 70 to emit light in the selected pixel to the pixel electrode 710. The driving gate electrode 155 is connected to the capacitor plate 158 connected with the switching drain electrode 174. Both of the driving source electrode 176 and the other capacitor plate 178 are connected to the common power supply line 172. The driving drain electrode 177 is connected to the pixel electrode 710 of the organic light emitting diode 70 through a contact hole.

By this structure, the switching thin film transistor 10 is operated by a gate voltage applied to the gate line 151 serving to transmit a data voltage applied to the data line 171 to the driving thin film transistor 20. A voltage corresponding to a difference between a common voltage applied to the driving thin film transistor 20 from the common power supply line 172 and the data voltage transmitted from the switching thin film transistor 10 is stored in the storage capacitor 80, and a current corresponding to the voltage stored in the storage capacitor 80 flows to the organic light emitting diode 70 through the driving thin film transistor 20 to allow the organic light emitting diode 70 to emit light.

The barrier film 200 including the inorganic barrier layer 210 and the organic barrier layer 220 is attached to the organic light emitting diode 70.

Further, the structures of the thin film transistors 10 and 20 and the organic light emitting diode 70 are not limited to those shown in FIGS. 4 and 5. That is, the structures of the thin film transistors 10 and 20 and the organic light emitting diode 70 may be modified within a scope that can be implemented by those skilled in the art.

Hereinafter, a method for manufacturing the organic light emitting diode display device 101 of FIG. 1 will be described in FIG. 10.

First, as shown in step 1, after the substrate body 111 that is divided into the display area DA and the neighboring area NA is provided, the organic light emitting diode 70 is formed in the display area DA of the substrate body 111. In this process, the driving circuit DC is also formed.

Next, as shown in step 2, the barrier film 200 on which the inorganic barrier layer 210 and the organic barrier layer 220 are alternately laminated is formed. More specifically, the barrier film 200 may be manufactured by a method of forming the inorganic barrier layer 210 on the organic barrier layer 220 as a base. At this time, while the inorganic barrier layer 210 is formed, the groove pattern 215 is recessed on the edge of the inorganic barrier layer 210. The groove pattern 215 surrounds the organic light emitting diode 70. More specifically, the groove pattern 215 has a quadrangular spiral shape surrounding the organic light emitting diode 70. Further, a vertical cross-section of the groove pattern 215 has the angular saw-tooth shape.

Next, as shown in step 3, the neighboring area NA of the substrate body 111 and the inorganic barrier layer 210 are attached to each other by using the adhesive agent 250 so that the barrier film 200 covers the organic light emitting diode 70. At this time, the groove pattern 215 is positioned on one surface of the inorganic barrier layer 210 that is in contact with the adhesive agent 250.

Figure 10:
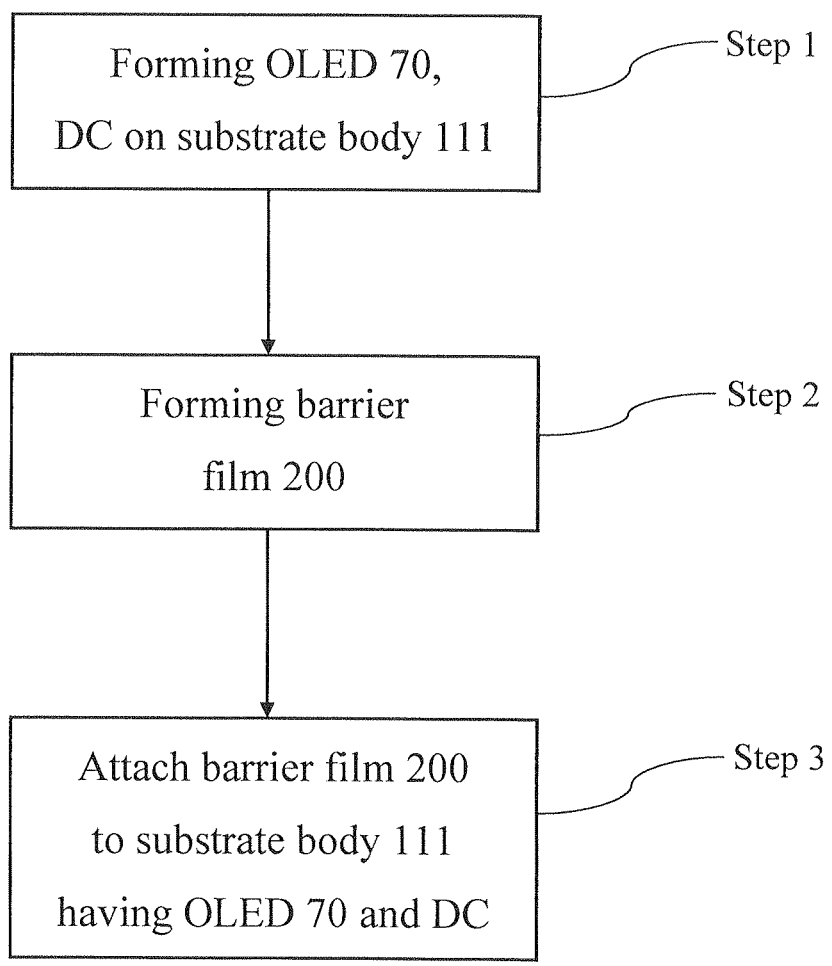
FIG. 10 is a block diagram showing a procedural process of manufacturing an organic light emitting diode display device constructed as the first embodiment as shown in FIG. 1.

By the manufacturing method of FIG. 10, the method for manufacturing the organic light emitting diode display device 101 constructed as the first embodiment may effectively prevent the moisture or oxygen from penetrating the organic light emitting layer 720 by using the barrier film 200, and may manufacture the organic light emitting diode display device 101 having a slim thickness.

Hereinafter, referring to FIG. 6, a second embodiment will be described.

Figure 6:
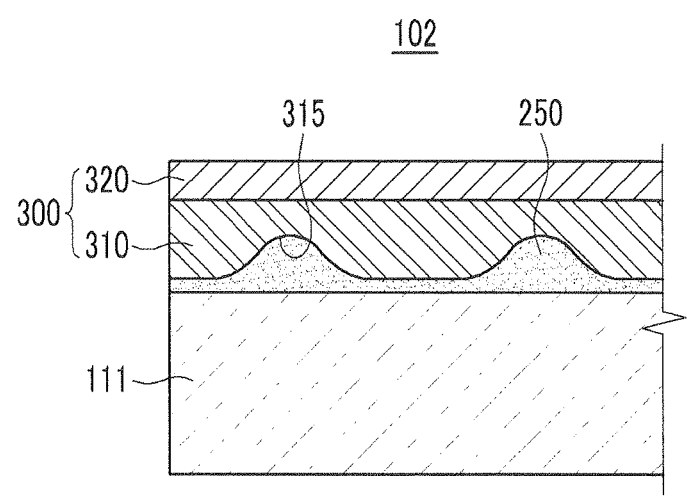
FIG. 6 is a partial cross-sectional view of an organic light emitting diode display device constructed as a second embodiment.

As shown in FIG. 6, in an organic light emitting diode display device 102 constructed as the second embodiment, a vertical cross-section of a groove pattern 315 formed on an inorganic barrier layer 310 of a barrier film 300 has a curved saw-tooth shape. In other words, the groove pattern 315 includes recesses formed in a wave shape, and the adhesive agent 250 may be disposed in direct contact with the groove pattern 315 and has a wave shape which corresponds to the shape of the groove pattern 315. Accordingly, the groove pattern 315 may be comparatively easily formed. In addition, an organic barrier layer 320 is formed on the inorganic barrier layer 310.

By this configuration, the organic light emitting diode display device 102 constructed as the second embodiment has an overall slim thickness while effectively preventing the moisture or oxygen from penetrating an organic emission layer 720 through the barrier film 300.

Further, a method for manufacturing the organic light emitting diode display device 102 according to the second embodiment is the same as the method for manufacturing the organic light emitting diode display device 101 according to the first embodiment, except that the vertical cross-section of the groove pattern 315 has the curved saw-tooth shape.

Hereinafter, referring to FIG. 7, a third embodiment will be described.

Figure 7:
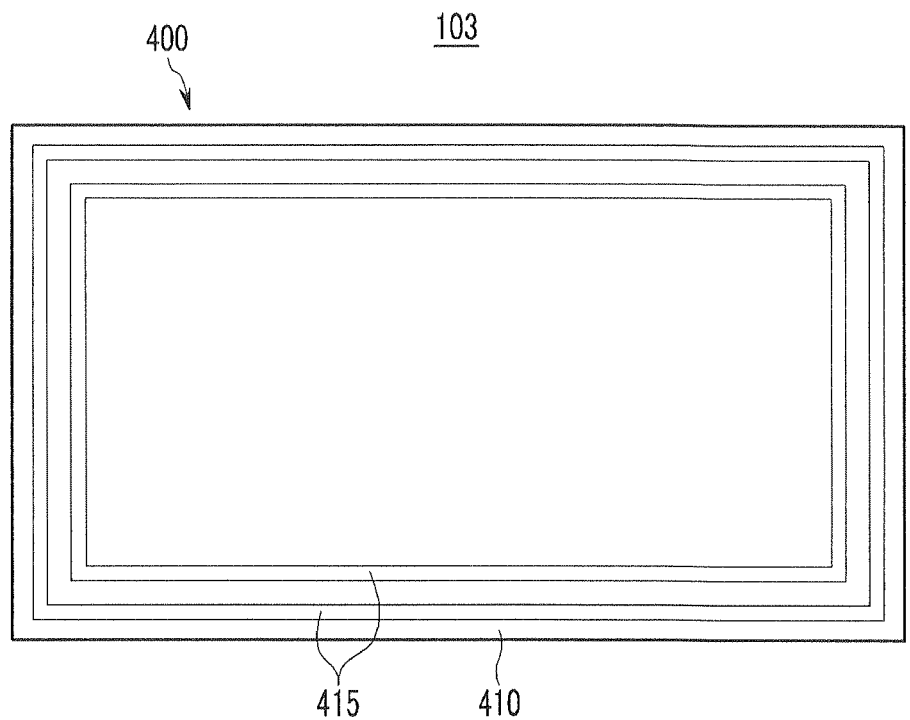
FIG. 7 is a plan layout view of an organic light emitting diode display device constructed as a third embodiment.

As shown in FIG. 7, an organic light emitting diode display device 103 constructed as the third embodiment is constituted by a plurality of quadrangles in which a groove pattern 415 is formed on an inorganic barrier layer 410 of a barrier film 400 surrounding an organic light emitting diode 70.

By this configuration, the organic light emitting diode display device 103 constructed as the third embodiment also has an overall slim thickness while effectively preventing moisture or oxygen from penetrating an organic emission layer 720 through the barrier film 400.

Further, a method for manufacturing the organic light emitting diode display device 103 constructed as the third embodiment is the same as the method for manufacturing the organic light emitting diode display device 101 constructed as the first embodiment, except that the groove pattern 415 is constituted by the plurality of quadrangles.

Hereinafter, referring to FIG. 8, a fourth embodiment will be described.

Figure 8:
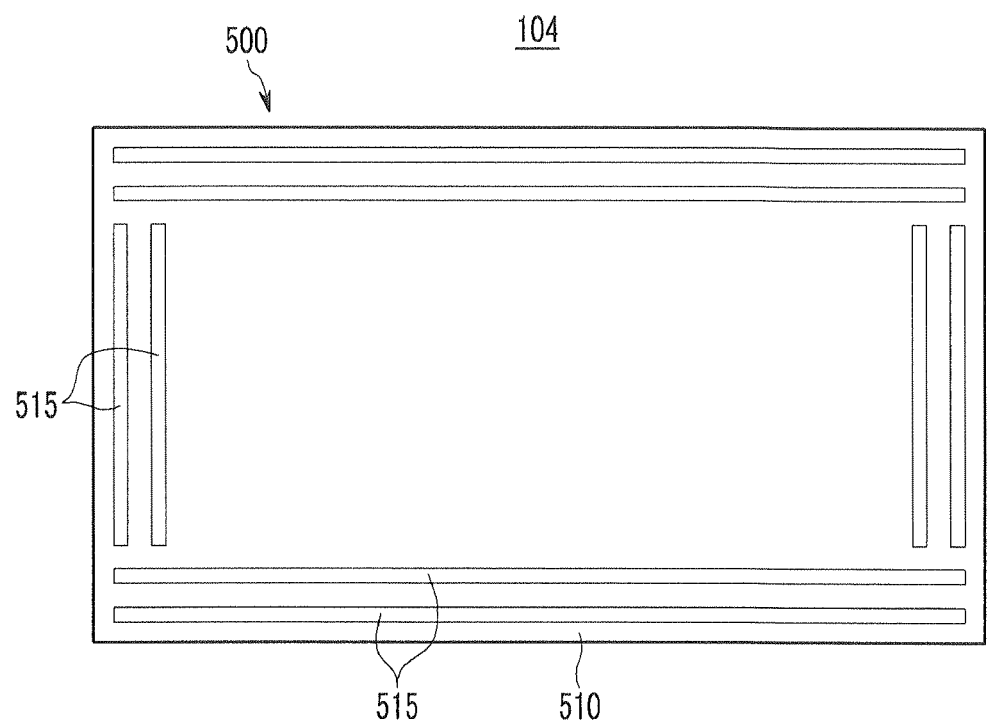
FIG. 8 is a plan layout view of an organic light emitting diode display device constructed as a fourth embodiment.

As shown in FIG. 8, in an organic light emitting diode display device 104 constructed as the fourth embodiment, a groove pattern 515 formed on an inorganic barrier layer 510 of a barrier film 500 is constituted by a plurality of bars that are formed on the edges of a substrate body 111. The groove pattern 515 formed on an inorganic barrier layer 510 of a barrier film 500 may be constituted by a plurality of discrete bars that are formed on all edges of the substrate body 111.

By this configuration, the organic light emitting diode display device 104 constructed as the fourth embodiment also has an overall slim thickness while effectively preventing moisture or oxygen from penetrating an organic emission layer 720 through the barrier film 500.

Further, a method for manufacturing the organic light emitting diode display device 104 constructed as the fourth embodiment is the same as the method for manufacturing the organic light emitting diode display device 101 constructed as the first embodiment, except that the groove pattern 515 is constituted by the plurality of bars.

Hereinafter, referring to FIG. 9, a fifth embodiment will be described.

Figure 9:
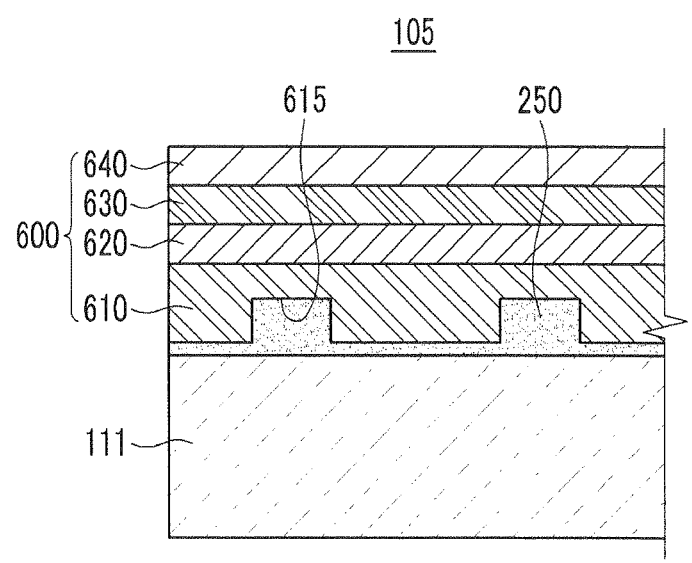
FIG. 9 is a partial cross-sectional view of an organic light emitting diode display device constructed as a fifth embodiment.

As shown in FIG. 9, an organic light emitting diode display device 105 constructed as the fifth embodiment includes a barrier film 600 including a plurality of inorganic barrier layers 610 and 630 and a plurality of organic barrier layers 620 and 640. The inorganic barrier layer 610 is disposed on the lowermost layer facing towards an organic light emitting diode 70 and an adhesive agent 250. In addition, the organic barrier layers 620 and 640 and the inorganic barrier layer 630 are alternately laminated on the inorganic barrier layer 610 that is the lowermost layer.

Further, a groove pattern 615 is recessed on one surface of the inorganic barrier layer 610 that is in direct contact with the adhesive agent 250 in a neighboring area NA of a substrate body 111.

By this configuration, the organic light emitting diode display device 105 constructed as the fifth embodiment may more stably and efficiently prevent moisture or oxygen from penetrating an organic emission layer 720 through the barrier film 600.

The inorganic barrier layers 610 and 630 having a dense thin film primarily prevent the moisture or oxygen from penetrating. In addition, the organic barrier layers 620 and 640 additionally prevent the moisture or oxygen from penetrating. Meanwhile, the organic barrier layers 620 and 640 also serve as buffer layers reducing the stress between layers generated by bending of the organic light emitting diode display device 105 between the inorganic barrier layers 610 and 630 in addition to preventing water vapor transmission.

Further, a method for manufacturing the organic light emitting diode display device 105 constructed as the fifth embodiment is the same as the method for manufacturing the organic light emitting diode display device 101 constructed as the first embodiment, except that the organic light emitting diode display device includes the plurality of inorganic barrier layers 610 and 630 and the plurality of organic barrier layers 620 and 640 of the barrier film 600.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
    a substrate body that is divided into a display area and a neighboring area;
    an organic light emitting diode formed in the display area of the substrate body;
    a barrier film that is attached to the substrate body with the organic light emitting diode disposed between the barrier film and the substrate body, the barrier film comprising an inorganic barrier layer and an organic barrier layer formed on the inorganic barrier layer, the organic barrier layer disposed spaced apart from the substrate body by the inorganic barrier layer; and
    an adhesive agent disposed between the neighboring area of the substrate body and the barrier film,
    with a groove pattern being recessed on the surface of the barrier film that is in contact with the adhesive agent.

2. The organic light emitting diode display device of claim 1, wherein
    the inorganic barrier layer is formed on the adhesive agent.

3. The organic light emitting diode display device of claim 2, wherein
    the barrier film further includes one or more additional inorganic barrier layers formed on the organic barrier layer.

4. The organic light emitting diode display device of claim 3, wherein
    the barrier film further includes one or more additional organic barrier layer formed on the additional inorganic barrier layers.

5. The organic light emitting diode display device of claim 4, wherein
    the additional inorganic barrier layers and the additional organic barrier layers are alternately laminated.

6. The organic light emitting diode display device of claim 1, wherein
    the groove pattern surrounds the organic light emitting diode.

7. The organic light emitting diode display device of claim 6, wherein
    the groove pattern has a quadrangular spiral shape.

8. The organic light emitting diode display device of claim 6, wherein
    the groove pattern is constituted by a plurality of quadrangles.

9. The organic light emitting diode display device of claim 6, wherein
    the groove pattern is constituted by a plurality of bars formed on the periphery of the substrate body.

10. The organic light emitting diode display device of claim 6, wherein
    a vertical cross-section of the groove pattern has an angled saw-tooth shape.

11. The organic light emitting diode display device of claim 6, wherein
    a vertical cross-section of the groove pattern has a curved saw-tooth shape.

12. The organic light emitting diode display device of claim 6, wherein
    the substrate body is flexible.

13. A method for manufacturing an organic light emitting diode display device, comprising:
    preparing a substrate body that is divided into a display area and a neighboring area;
    forming an organic light emitting diode within the display area of the substrate body;
    forming a barrier film where one or more inorganic barrier layers and one or more organic barrier layers are alternately laminated, with the organic barrier layer disposed spaced apart from the substrate body by the inorganic barrier layer; and
    attaching the inorganic barrier layer of the barrier film to the neighboring area of the substrate body by using an adhesive agent so that the barrier film covers the organic light emitting diode,
    with a groove pattern being recessed on the surface of the inorganic barrier layer that is in contact with the adhesive agent.

14. The method of claim 13, wherein
    the substrate body is flexible.

15. The method of claim 13, wherein
    the groove pattern surrounds the organic light emitting diode.

16. The method of claim 15, wherein
    the groove pattern has a quadrangular spiral shape.

17. The method of claim 15, wherein
    the groove pattern is constituted by a plurality of quadrangles.

18. The method of claim 15, wherein
    the groove pattern is constituted by a plurality of bars formed on the periphery of the substrate body.

19. The method of claim 13, wherein
    a vertical cross-section of the groove pattern has an angled saw-tooth shape.

20. The method of claim 13, wherein
    a vertical cross-section of the groove pattern has a curved saw-tooth shape.

* * * * *